United States Patent [19]

Brambilla et al.

[11] Patent Number: 5,210,481
[45] Date of Patent: May 11, 1993

[54] VOLTAGE/CURRENT CHARACTERISTICS CONTROL CIRCUIT PARTICULARLY FOR PROTECTING POWER TRANSISTORS

[75] Inventors: Davide Brambilla, Rho; Edoardo Botti, Vigevano, both of Italy

[73] Assignee: SGS-Thomson Microelectronics S.r.l., Milan, Italy

[21] Appl. No.: 808,484

[22] Filed: Dec. 17, 1991

[30] Foreign Application Priority Data

Dec. 20, 1990 [IT] Italy .................. 22448 A/90

[51] Int. Cl.$^5$ .................................. G05F 3/16
[52] U.S. Cl. ........................... 323/316; 323/315; 361/79; 361/93
[58] Field of Search ............ 323/315, 316; 361/79, 361/93; 307/289; 330/207 P, 298

[56] References Cited

U.S. PATENT DOCUMENTS

| | | | |
|---|---|---|---|
| 4,225,897 | 9/1980 | Kaplan | 361/87 |
| 4,233,556 | 11/1980 | Nagel et al. | 322/28 |
| 4,302,792 | 11/1981 | Harwood | 361/92 |
| 4,599,578 | 7/1986 | Seevinck | 330/298 |
| 4,680,664 | 7/1987 | Leuthen | 361/91 |
| 4,789,842 | 12/1988 | Naxera | 330/298 |
| 4,918,563 | 4/1990 | Kanai et al. | 361/91 |
| 5,008,586 | 4/1991 | Miyazaki et al. | 323/315 |

FOREIGN PATENT DOCUMENTS 3240649 5/1983 Fed. Rep. of Germany.
3202319 7/1983 Fed. Rep. of Germany.

Primary Examiner—Steven L. Stephan
Assistant Examiner—Adolf D. Berhane
Attorney, Agent, or Firm—Townsend and Townsend Khourie and Crew

[57] ABSTRACT

Voltage/current characteristics control circuit particularly for protecting power transistors, which comprises at least one power transistor; the emitter terminal of a first transistor is directly connected to the output of the power transistor; the emitter terminal of a second transistor is connected to the first terminal of the power transistor by means of a first resistor. The collector terminal and the base terminal of the first transistor are connected to a current source. The base terminal of the first transistor is connected to the base terminal of the second transistor, and the circuit furthermore comprises a protection circuitry. The circuitry is connected to the collector terminal of the second transistor through a differential stage which comprises a third transistor and a fourth transistor; the third transistor and fourth transistor have a respective second resistor and third resistor arranged in series. Divider means are furthermore provided and are interposed between the second terminal of the power transistor and the base terminals of the third transistor and fourth transistor.

15 Claims, 3 Drawing Sheets

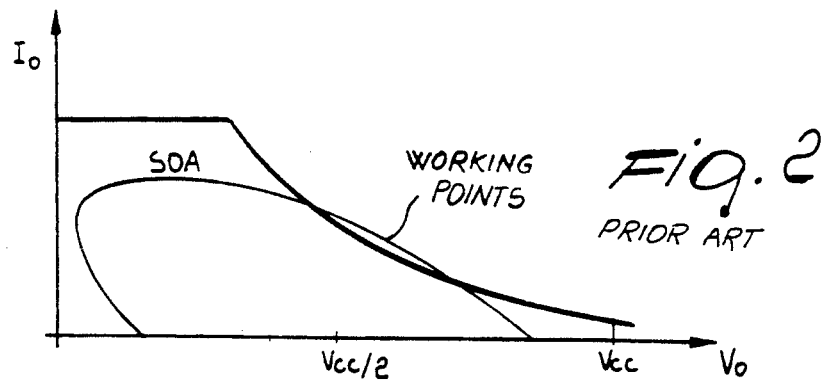
Fig. 2 PRIOR ART
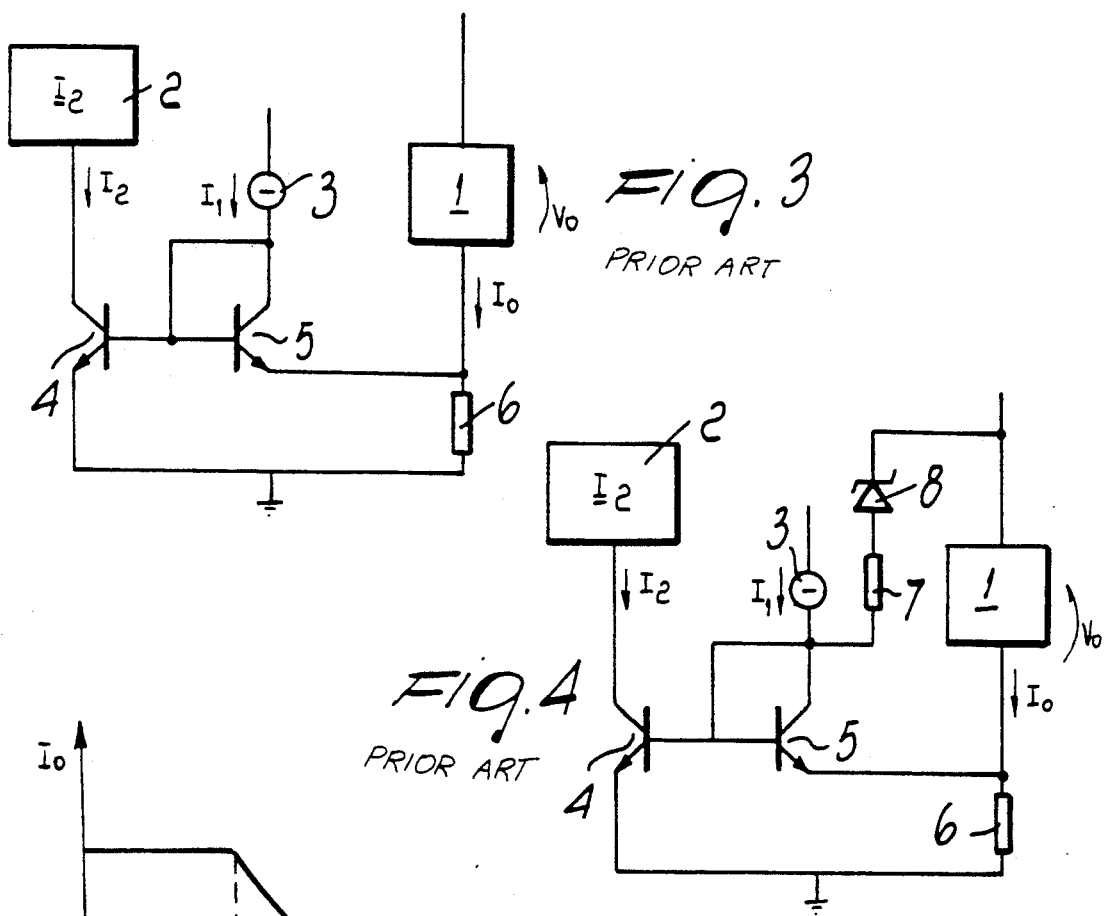
Fig. 3 PRIOR ART
Fig. 4 PRIOR ART
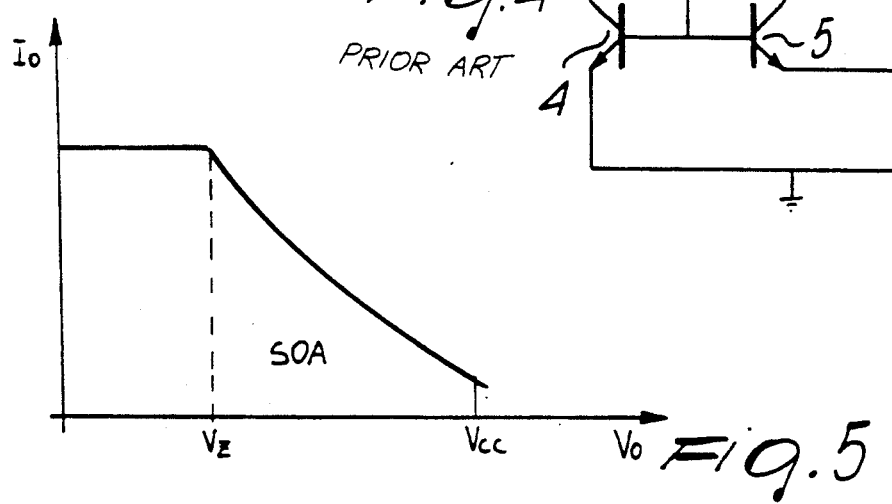
Fig. 5 PRIOR ART

VOLTAGE/CURRENT CHARACTERISTICS CONTROL CIRCUIT PARTICULARLY FOR PROTECTING POWER TRANSISTORS

BACKGROUND OF THE INVENTION

The present invention relates to a voltage/current characteristics control circuit particularly for protecting power transistors.

In power integrated circuits, the need is increasingly felt to adequately protect power transistors, whether in MOS technology or in bipolar technology, from overloads. Power transistors, like all transistors, in fact have, in the voltage/current plane, as more clearly illustrated in FIG. 1, an operating area usually termed SOA, which is the acronym of Safe Operating Area.

The working point of the device must always be within the SOA, under penalty of the destruction of the device itself; an event which push the device outside the SOA obviously requires rapid and drastic maintenance interventions, thus increasing the management costs of the machine or apparatus in which this event may occur.

The boundaries of the SOA are usually defined by three limits: the maximum current $I_{MAX}$ which can be withstood by the output device, its maximum voltage $V_{MAX}$ and the maximum power which can be dissipated by the device.

In the case of devices, the situation is further limited by the well-known phenomenon of II breakdown, indicated in FIG. 1 by the broken line, which is ultimately the main restriction in the manufacture of bipolar power devices for high voltages, i.e., with a supply voltage $V_{cc}$ higher than 30 volts.

Furthermore, in particular conditions, such as an amplifier with a partially inductive load, the SOA can rather often be abandoned by the locus of the points of the voltage/current plane which represent the work point region, as more clearly illustrated in FIG. 2. This boundary crossing unavoidably entails the final destruction of the device.

The technical problem therefore consists in manufacturing protection circuits which detect when the power transistor is going to cross the boundaries of the SOA and switch it off in this case.

The situation is even worse when the difference between the boundary of the SOA and the work point is very small; the protection circuits must therefore have such a resolution as to follow the SOA as closely as possible, so as to avoid switching the transistor off when instead it is still within the SOA, i.e., in normal operating conditions.

Finally, the manufacture of said protection circuits and, most of all, their operating stability with respect to variations of the production processes for their manufacture is one of the main problems of protection circuits.

SUMMARY OF THE INVENTION

The aim of the present invention is to eliminate or substantially reduce the disadvantages described above in known types of known control circuits by providing a voltage/current characteristics control circuit particularly for protecting power transistors which faithfully follows the boundaries of the SOA in order to switch the power transistor off when the work point exceeds said boundaries.

Within the scope of this aim, an object of the present invention is to provide a control circuit which is stable in operation even if the manufacturing process varies.

Not the least object of the present invention is to provide voltage/current characteristics control circuit particularly for protecting power transistors which is relatively easy to manufacture and at competitive costs.

This aim, these objects and others which will become apparent hereinafter are achieved by a voltage/current characteristics control circuit particularly for protecting power transistors according to the invention, comprising at least one power transistor, the emitter terminal of a first transistor being directly connected to the output of said power transistor, the emitter terminal of a second transistor being connected to the first terminal of said power transistor by means of a first resistor, the collector terminal and the base terminal of said first transistor being connected to a current source, the base terminal of said first transistor being connected to the base terminal of said second transistor and comprising a protection circuitry, characterized in that said protection circuitry is connected to the collector terminal of said second transistor through a differential stage which comprises a third transistor and a fourth transistor, said third transistor and fourth transistor having a respective second resistor and third resistor arranged in series, divider means being provided, said divider mean being interposed between the input terminal of said at least one power transistor and the base terminals of said third transistor and fourth transistor.

BRIEF DESCRIPTION OF THE DRAWINGS

Further features and advantages of the invention will become apparent from the description of a preferred but not exclusive embodiment of a voltage/current characteristics control circuit particularly for protecting power transistors according to the invention, illustrated only by way of non-limitative example in the accompanying drawings, wherein:

FIG. 2 is a voltage/current plot of the SOA with a region of working points;

FIG. 3 is a diagram of a known protection circuit;

FIG. 4 is a diagram of another known protection circuit;

FIG. 5 is a voltage/current plot of the SOA of the circuit of FIG. 4;

DESCRIPTION OF THE PREFERRED EMBODIMENTS

Figure 11:
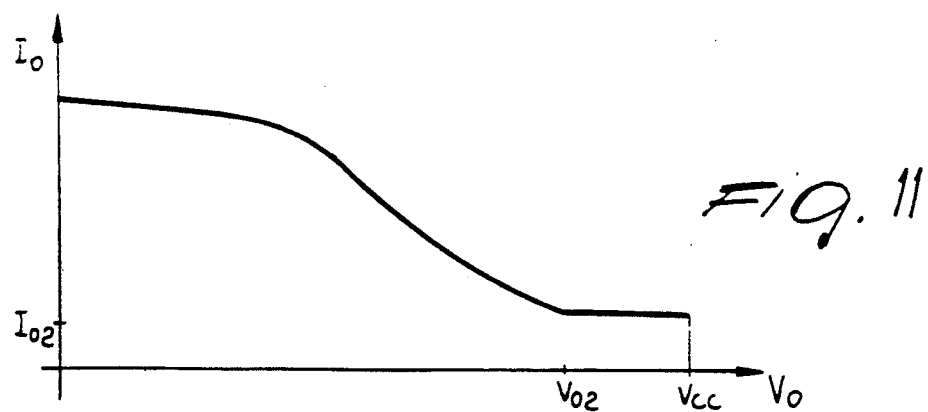
FIG. 11 is a voltage/current plot of the SOA of the circuit of FIG. 7 completed by the divider of FIG. 10.

With reference to FIG. 3, said figure schematically illustrates the basic circuit for detecting the current which flows in a power device 1. Said circuit comprises a protection circuitry 2 and a current source 3, which are respectively connected to respective collector terminals of a first NPN transistor 4 and of a second NPN transistor 5 which are current-mirror connected. In other words, the base terminals of the two transistors 4 and 5 are connected to one another, to the collector terminal of the second transistor 5 and to the current source 3.

The emitter terminal of the first transistor 4 is connected to a terminal of a first resistor 6 and is connected to the ground, whereas the emitter terminal of the second transistor 5 is connected to an output terminal of the power device 1 and to the other terminal of the first resistor 6.

If the current output from the device 1, termed $I_0$, is zero, the voltage drop across the first resistor 6 is zero and the current $I_2$ which is mirrored by the transistors 4 and 5 is equal to the current I1 generated by the source 3.

If a non-zero current $I_0$ flows in the device 1, the voltage drop across the first resistor 6 causes the current $I_2$ to increase until it reaches the threshold value $I_2$, whose exceeding causes the intervention of the protection circuit 2.

In this circuit, the protection circuit 2 is thus sensitive to the output current and is therefore not suitable for high-voltage circuits.

The circuit illustrated in FIG. 4 is an improvement with respect to the above described circuit. In this known type of circuit, without changing the references previously provided, a series constituted by a resistor 7 connected to the anode of a Zener diode 8 is connected to the base terminal, to the collector terminal of the second transistor 5 and to the current source 3. The cathode of the Zener diode 8 is connected to the input terminal of the power device 1.

In this last circuit, so long as the voltage $V_0$ across the power device 1 is lower than the Zener voltage $V_Z$, the circuit limits the current $I_0$ to the value $I_{OMAX}$ as in the preceding circuit; if the voltage $V_0$ exceeds the Zener voltage $V_Z$, the current which flows in the first transistor 4 also increases, and a smaller voltage drop across the first resistor 6 is accordingly necessary in order to reach the current value $I_2$ which activates the protection circuitry 2. The protection curve of the circuit of FIG. 4 is shown in FIG. 5.

Figure 6:
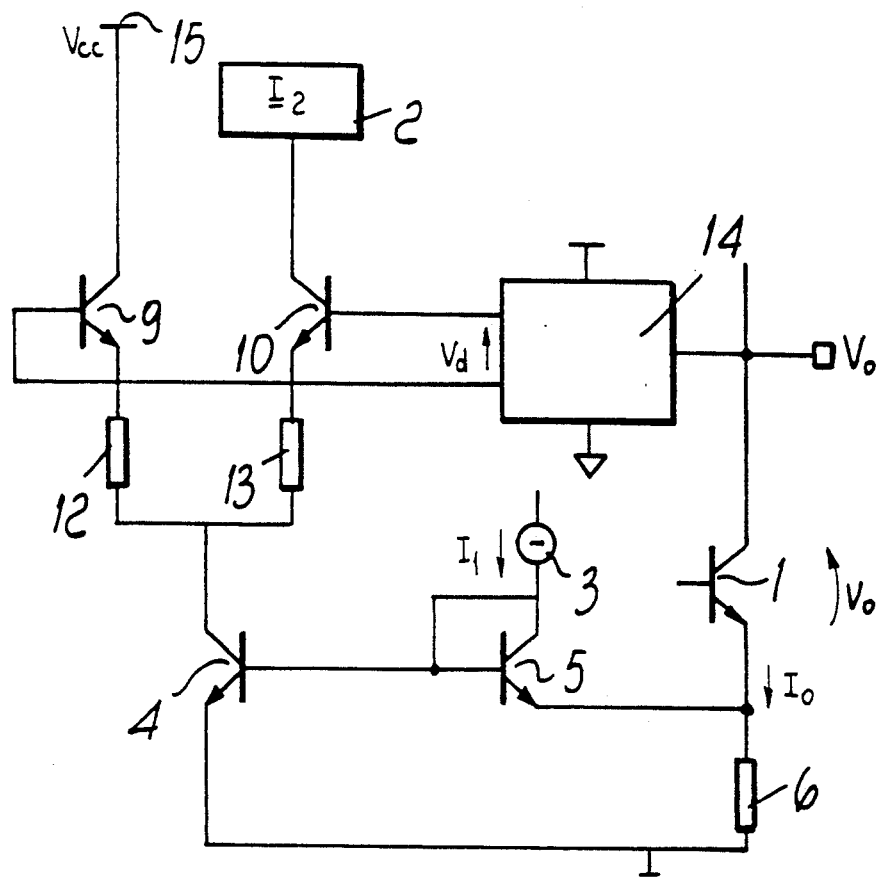
FIG. 6 is a diagram of a protection circuit according to the invention.

With reference to FIG. 6, a voltage/current characteristics control circuit particularly for protecting power transistors comprises the above components, whose reference numerals are maintained in FIG. 6 for the sake of clarity. The protection circuitry 2 is connected to the collector terminal of the first transistor 4 through a differential stage which comprises a third transistor 9 and a fourth transistor 10. Said third and fourth transistors have a respective second resistor 12 and third resistor 13 connected in series to the collector of the first transistor 4. Divider means 14, described hereinafter, are furthermore provided and interposed between the input terminal of the power transistor or power device 1 and the base terminals to the third transistor 9 and of the fourth transistor 10.

The third transistor 9 has its collector terminal connected to a supply voltage 15 which is equal in value to $V_{cc}$ and its emitter terminal connected, by means of the second resistor 12, to the collector terminal of the first transistor 4 and to the emitter terminal of the fourth transistor 10 by means of the third resistor 13.

The collector terminal of the fourth transistor 10 is connected to the protection circuitry 2.

The current $I_2$ is a function of the current $I_0$ according to the following rule:

$$I_2 = I_1 (A_4/A_5) \exp(I_0 R_6/V_T)$$

where $R_6$ is the resistance value of the resistor 6, $V_T$ is the thermal voltage, which is usually equal to 26 millivolts, and $(A_4/A_5)$ is the area ratio between the first transistor 4 and the second transistor 5.

In order to also make the circuit sensitive to the voltage $V_0$ of the power device 1 to be protected, the current $I_2$ is divided by the differential stage constituted by the third transistor 9 and by the fourth transistor 10. The differential stage is furthermore intentionally degenerated by means of the presence of the second resistor 12 and of the third resistor 13.

Figure 7:
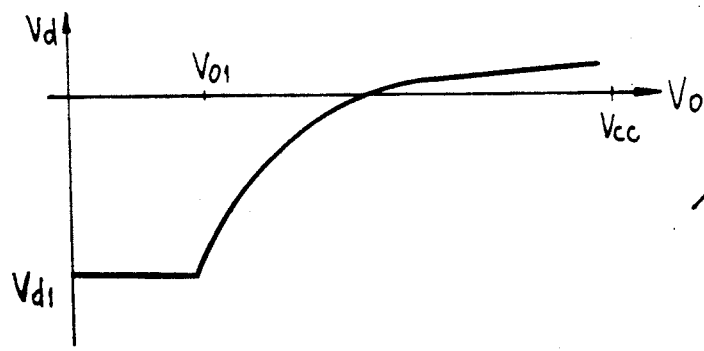
FIG. 7 is a voltage/voltage plot of the behavior of a differential voltage of the circuit according to the invention.

The described differential stage is driven by the divider means 14, which are better explained hereinafter and provide it both with bias and with the difference voltage $V_D$. The voltage $V_D$ is a function of the voltage $V_0$ and has a behavior which is qualitatively illustrated in FIG. 7.

Figure 8:
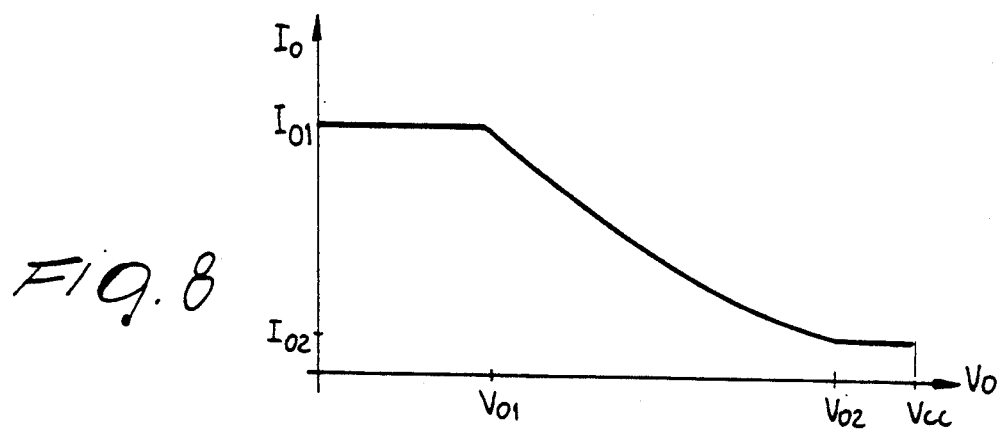
FIG. 8 is a voltage/current diagram of the SOA of the circuit of FIG. 7.
Figure 1:
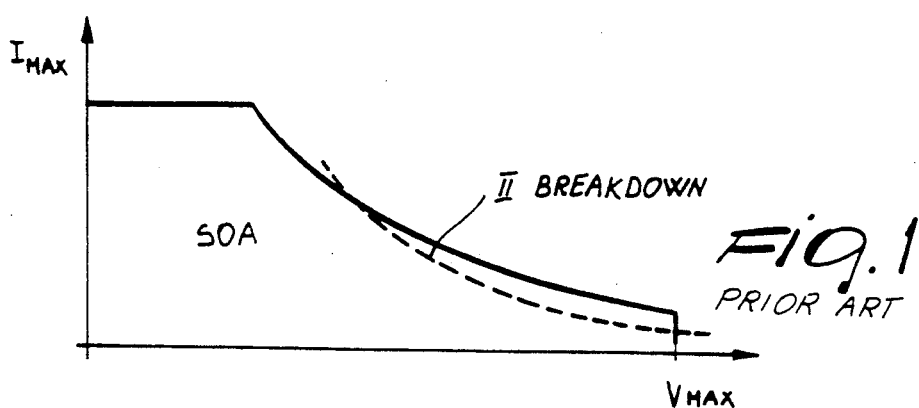
FIG. 1 is a voltage/current plot of the Safe Operating Area (SOA)

For high voltages $V_O$, the voltage $V_D$ is positive and all the current $I_2$ flows through the fourth transistor 10. When the current $I_2$ reaches the threshold value $I_2$, the protection intervenes and switches off the device 1. In this region of the SOA, as illustrated in FIG. 8, the current $I_0$ is limited to the value $I_{02}$ for $V_0 > V_{02}$.

With lower voltages $V_0$, $V_D$ is initially null and then becomes increasingly negative. The current $I_2$ thus flows partly in the third transistor 9 and partly in the fourth transistor 10. A higher current $I_0$ is therefore necessary in order to reach the threshold current $I_2$ and to make the protection circuit intervene. The resulting curve is shown in FIG. 8.

As is evident from the plot of FIG. 8, if the device is to be protected below the voltage $V_0 = V_{01}$ at a constant current $I_0 = I_{01}$, it is necessary to fix the differential voltage $V_D$ at the output of the divider means 14 at a constant value equal to $V_D = V_{D1}$. Therefore the transfer function of the divider means 14, i.e. $V_D = V_D(V_0)$, must be calculated in order to follow the SOA curve as closely as possible.

Figure 9:
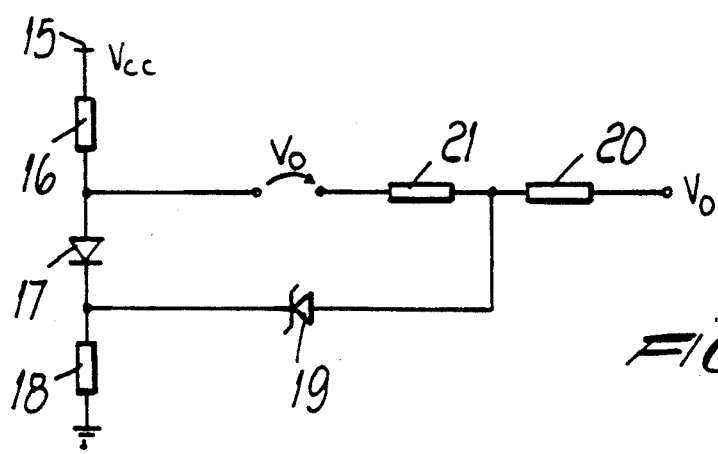
FIG. 9 is a diagram of a nonlinear divider comprised within the circuit of FIG. 7.

With reference to FIG. 9, the divider means 14 comprise a fourth resistor 16 which is connected to the supply voltage 15 and to the anode of a diode 17 whose cathode is connected to a fifth resistor 18 which is connected to ground. The cathode of the diode 17 is connected to the base terminal of the third transistor 9.

The cathode of a Zener diode 19 is connected to the cathode of the diode 17; the anode of said Zener diode is connected, by means of a sixth resistor 20, to the input terminal of the power device 1 and is connected to the base terminal of the fourth transistor 10 by means of a seventh resistor 21.

The divider means 14 are thus a non-linear divider with various slopes which allows to follow the SOA curve with good approximation, and the plot of the transfer function $V_D = V_D(V_0)$ of the divider means 14 described above is shown in FIG. 10. The protection curve thus obtained is the one graphically illustrated in FIG. 11.

The present invention conveniently allows to approximate the protection curve of the power device 1 very closely and in an easily reproducible manner even with a simple three-slope non-linear divider 14 such as the one illustrated by way of example in FIG. 9.

Figure 10:
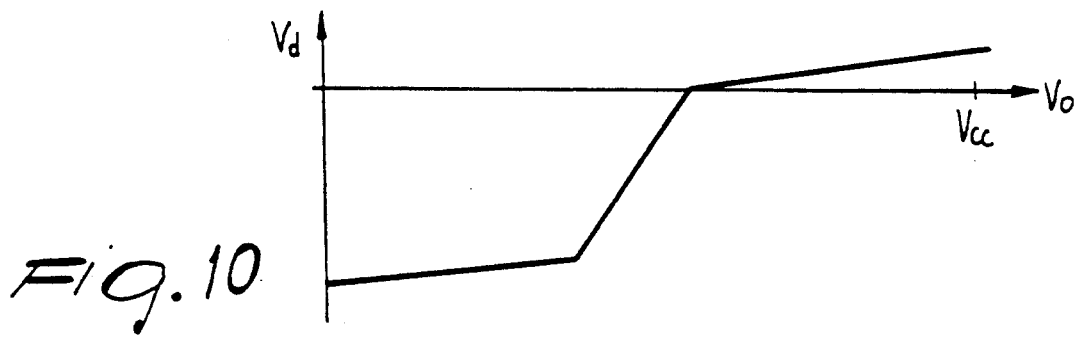
FIG. 10 is a voltage/voltage plot of the behavior of a differential voltage in the divider of FIG. 9.

The curve defined by the divider 14 is shown in FIG. 10, and the protection curve of the device 1 obtained by the circuit of FIG. 6 is the one illustrated in FIG. 11

With the previously described known circuit of FIG. 4, $V_0$ is in fact detected by increasing the reference current $I_1$ by means of the Zener diode 8 and of the resistor 7, and it is difficult to couple this additional current to the trigger current $I_2$, especially from the point of view of temperature variations and of variations in the Zener voltage $V_Z$ which are due to the production process.

Advantageously, in the circuit according to the invention one acts by accurately dividing the current $I_2$ by means of the differential stage constituted by the transistors 9 and 10 and by the divider 14 which depends exclusively on resistance ratios, as illustrated in FIG. 6, obtaining protection curves which are more reproducible and temperature-stable.

The invention thus conceived is susceptible to numerous modifications and variations, all of which are within the scope of the inventive concept. From the structural point of view, the transistors 4, 5, 9 and 10 are NPN bipolar transistors, but nothing conceptually forbids the execution of a circuit according to the invention with PNP bipolar transistors, with the obvious necessary circuital adaptations. All the details may furthermore be replaced with other technically equivalent elements.

In practice, the materials employed, as well as the dimensions, may be any according to the requirements.

We claim:

1. A voltage/current characteristics control circuit particularly for protecting at least one power transistor, said power transistor having a first and second terminal, said circuit having an emitter terminal of a first transistor directly connected to the first terminal of said power transistor, an emitter terminal of a second transistor connected to the first terminal of said power transistor by means of a first resistor, a collector terminal and a base terminal of said first transistor connected to a current source, a base terminal of said second transistor connected to the base terminal connected to the collector terminal of said second transistor through a branch of a differential stage which comprises a third transistor and fourth transistor, said third transistor and fourth transistor having a respective second resistor and third resistor arranged in series, and a divider means interposed between the second terminal of said at least one power transistor and the base terminals of said third transistor and fourth transistor.

2. The control circuit according to claim 1, wherein said third transistor has its collector terminal connected to a supply voltage and its emitter terminal connected, by means of said second resistor, to the collector terminal of said second transistor and to the emitter terminal of said fourth transistor by means of said third resistor.

3. The control circuit according to claim 1, wherein said fourth transistor has its collector terminal connected to said protection circuitry.

4. The control circuit according to claim 1, wherein said divider means comprises a fourth resistor which is connected to said supply voltage and to the anode of a diode whose cathode is connected to a fifth resistor which is connected to ground.

5. The control circuit according to claim 4, wherein the base terminal of said third transistor is connected to said anode of said cathode.

6. The control circuit according to claim 5, wherein the cathode of a Zener diode is connected to said cathode of said diode, the anode of said Zener diode being connected, by means of a sixth resistor, to the second terminal of said at least one power transistor and being connected, by means of a seventh resistor, to the base terminal of said fourth transistor.

7. A voltage/current characteristics control circuit for protecting at least one power transistor, said power transistor having at least first and second terminals, said circuit comprising a first resistive means connected between said first terminal of said power transistor and a first supply voltage;

a first transistor having an emitter connected to said first terminal of said power transistor, a collector connected to a constant current source, and a base terminal connected to said collector terminal;

a second transistor having an emitter connected to said first supply voltage, a base connected to said base of said first transistor, and a collector;

first and second current paths connected in parallel to said collector of said second transistor;

a protection circuit in said first current path for turning off said one power transistor when current in said first current path exceeds a predetermined value; and means connected to said first and second current paths and to said second terminal of said one power transistor for dividing current through said second transistor between said first and second current paths responsive to voltage at said first terminal of said one power transistor;

whereby said one power transistor is protected from operating outside of its Safe Operating Area.

8. The voltage/current control circuit according to claim 7 wherein said current dividing means further comprises first and second differential transistors, each having an emitter and a collector in said first and second current paths respectively and a base, said emitter of said first and second differential transistors connected to said collector of said second transistor, said first differential transistor collector connected to said protection circuit, said second differential transistor collector connected to second voltage supply; and means connected to said bases of said first and second differential transistors and to said second terminal of said one power transistor for generating a differential voltage between said bases responsive to voltage at said second terminal of said one power terminal;

whereby current through second transistor is divided between said first and second current paths.

9. The voltage/current control circuit according to claim 7 wherein said differential voltage generating means operates such that, for voltages above a predetermined first amount at said power transistor second terminal, substantially all of said current through said second transistor flows through said first current path, and for voltages below said predetermined first amount, more current is diverted through said second current path as said voltage decreases until a predetermined second amount is reached below which voltage substantially no more current is diverted through said second current path.

10. The voltage/current control circuit according to claim 8 wherein said differential voltage generating means has first and second output terminals, said first output terminal connected to said base of said first differential transistor and said second output terminal connected to said base of said second differential transistor, voltage on said first output terminal positive with respect to voltage on said second output terminal at an initial high voltage at said power transistor second terminal, the difference in first and second output terminal voltages slowly falling toward zero, falling rapidly negative, and then remaining substantially constant as said voltage at said power transistor second terminal decreases from said high voltage to a low voltage.

11. The voltage/current control circuit according to claim 8 wherein said difference in first and second output terminal voltages slowly falls toward zero linearly along a first slope, falls rapidly negative linearly along a second slope, and then remains substantially constant as said voltage at said power transistor second terminal decreases from a high voltage to a low voltage.

12. The voltage/current control circuit according to claim 11 wherein said differential voltage generating means further comprises a diode having an anode and a cathode;

a fourth resistive means connected between said second supply voltage and said diode anode; and a fifth resistive means connected between said first supply voltage and said diode cathode.

13. The voltage/current control circuit as in claim 12 wherein said base of said second differential transistor is connected to said diode anode.

14. The voltage/current control circuit as in claim 13 wherein said differential voltage generating means further comprises a Zener diode having an anode and a cathode, said Zener diode cathode connected to diode cathode;

a sixth resistive means connected between said Zener diode anode and said second terminal of said one power transistor; and a seventh resistive means connected between said Zener diode anode and said base of said first differential transistor.

15. The voltage/current control circuit according to claim 7 further comprises second and third resistive means, said second resistive means connected between said emitter of said first differential transistor and said collector of said second transistor, and said third resistive means connected between said emitter of said second differential transistor and said collector of said second transistor.

* * * * *